(12) United States Patent
Wang et al.

(10) Patent No.: US 10,140,910 B2
(45) Date of Patent: Nov. 27, 2018

(54) SHIFT REGISTER, A GATE LINE DRIVING CIRCUIT, AN ARRAY SUBSTRATE AND A DISPLAY APPARATUS

(71) Applicants: BOE Technology Group Co., Ltd., Beijing (CN); Beijing BOE Display Technology Co., Ltd., Beijing (CN)

(72) Inventors: Junwei Wang, Beijing (CN); Ming Tian, Beijing (CN); Hongtao Lin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 174 days.

(21) Appl. No.: 15/233,421

(22) Filed: Aug. 10, 2016

(65) Prior Publication Data

US 2017/0193887 A1 Jul. 6, 2017

(30) Foreign Application Priority Data

Jan. 5, 2016 (CN) .......................... 2016 1 0006035

(51) Int. Cl.
*G09G 3/20* (2006.01)
*G11C 19/28* (2006.01)
(Continued)

(52) U.S. Cl.
CPC ......... *G09G 3/2092* (2013.01); *G09G 3/3677* (2013.01); *G11C 19/184* (2013.01);
(Continued)

(58) Field of Classification Search
CPC ... G09G 2300/0426; G09G 2310/0286; G09G 2310/0289; G09G 2310/08; G09G 3/3677;
(Continued)

(56) References Cited

U.S. PATENT DOCUMENTS 7,873,140 B2 * 1/2011 Moon .................... G11C 19/28
327/213
9,378,692 B2 * 6/2016 Chen ...................... G11C 19/28
(Continued)

FOREIGN PATENT DOCUMENTS

CN 102654986 * 9/2012
CN 102708986 * 10/2012

*Primary Examiner* — Kenneth Bukowski
(74) *Attorney, Agent, or Firm* — Westman, Champlin & Koehler, P.A.

(57) ABSTRACT

The present disclosure provides a shift register, a gate line driving circuit, an array substrate and a display apparatus. The shift register comprises: an inputting circuit for controlling a potential of a pulling up node (PU); a pulling down driving circuit for controlling the potentials of the PU and a pulling down node to be different; a resetting circuit for pulling down the PU and a signal outputting terminal (Output); a first outputting circuit for pulling down the Output; a second outputting terminal for outputting a signal from a clock signal terminal via the Output; a controlling circuit for connecting the second outputting circuit with the PU when the PU is at a high level and pulling the first terminal of the second outputting circuit down to a potential as twice as the potential of the low level signal terminal when the PU is at a low level.

20 Claims, 8 Drawing Sheets

(51) Int. Cl.
  *G09G 3/36* (2006.01)
  *G11C 19/18* (2006.01)
(52) U.S. Cl.
  CPC ..... *G11C 19/28* (2013.01); *G09G 2310/0286* (2013.01); *G09G 2310/08* (2013.01)
(58) Field of Classification Search
  CPC ......... G09G 3/3688; G09G 2300/0408; G11C 19/28; G11C 19/287
  See application file for complete search history.

(56) References Cited

U.S. PATENT DOCUMENTS

| | | | | |
|---|---|---|---|---|
| 2010/0109738 A1* | 5/2010 | Chien | ................... | G09G 3/3677 327/295 |
| 2010/0214279 A1* | 8/2010 | Kim | ................... | G09G 3/344 345/213 |
| 2011/0142191 A1* | 6/2011 | Tobita | ................... | G11C 19/184 377/64 |
| 2011/0158377 A1* | 6/2011 | Hsu | ................... | G09G 3/3677 377/79 |
| 2013/0088265 A1* | 4/2013 | Chen | ................... | H03K 5/153 327/108 |
| 2014/0159997 A1* | 6/2014 | Chen | ................... | G09G 3/3611 345/87 |
| 2014/0168409 A1* | 6/2014 | Kaga | ................... | H03M 7/12 348/86 |
| 2014/0176410 A1* | 6/2014 | Ma | ................... | G09G 3/3622 345/92 |
| 2014/0177780 A1* | 6/2014 | Qi | ................... | G09G 3/20 377/64 |
| 2014/0225882 A1* | 8/2014 | Wu | ................... | G09G 3/20 345/212 |
| 2014/0320466 A1* | 10/2014 | Son | ................... | G09G 3/20 345/204 |
| 2015/0243367 A1* | 8/2015 | Gu | ................... | G11C 19/28 377/64 |
| 2015/0255031 A1* | 9/2015 | Cao | ................... | G09G 3/3648 345/210 |
| 2015/0318052 A1* | 11/2015 | Li | ................... | G11C 19/28 377/64 |
| 2015/0346904 A1* | 12/2015 | Long | ................... | G09G 3/3677 345/174 |
| 2016/0012911 A1* | 1/2016 | Han | ................... | G09G 3/20 377/64 |
| 2016/0189652 A1* | 6/2016 | Xiao | ................... | G09G 3/3677 327/109 |
| 2017/0323609 A1* | 11/2017 | Zhao | ................... | G09G 3/3677 |

* cited by examiner

SHIFT REGISTER, A GATE LINE DRIVING CIRCUIT, AN ARRAY SUBSTRATE AND A DISPLAY APPARATUS

CROSS-REFERENCE TO RELATED APPLICATIONS

This application claims the benefit of Chinese Patent Application No. 201610006035.5, filed on Jan. 5, 2016, entitled "A Shift Register, A Gate Line Driving Circuit, An Array Substrate and A Display Apparatus" in the State Intellectual Property Office of China, the whole disclosure of which is incorporated herein by reference.

TECHNICAL FIELD

The present disclosure relates to a field of display technology, and more particular, to a shift register, a gate line driving circuit, an array substrate and a display apparatus.

BACKGROUND

Currently, a gate driving device is formed on an array substrate of a liquid crystal displayer by using an array process, i.e. a gate driver on array (GOA) process. A conventional gate drive device usually comprises a plurality of cascaded shift registers, and a signal outputted from a signal outputting terminal of the shift register in each stage is generally controlled by a pulling-up node and a clock signal. However, in a conventional shift register, during a holding phase of the signal outputting terminal (Output), a cut-off voltage for a gate of a thin film transistor in an outputting circuit comprising a clock signal terminal (CLK) is −8V, and the Output terminal is also pulled down to −8V by a low level signal terminal (Vss). In this manner, a voltage difference (Vgs) between the gate and the source of the thin film transistor is 0V. According to a transfer characteristic curve of a switch transistor, when the Vgs of the switch transistor is −8V, the switch transistor is turned off perfectly, i.e. it is equivalent to an open circuit. However, a leakage current will be large at a high temperature, resulting in the signal outputted from the Output terminal fluctuating with a high level of CLK terminal during a period in which the signal is supposed to be turned off. This will cause an abnormal display. Furthermore, it is difficult to make the transfer characteristic curve drift rightward by a traditional production process.

SUMMARY

Embodiments of the present disclosure provide a shift register, a gate line driving circuit, an array substrate and a display apparatus, which may enable a cut off negative voltage for a first terminal of a second outputting circuit being twice as a voltage for a low level signal terminal, so as to improve a stability of an output of the shift register.

According to an aspect of the embodiments of the present disclosure, a shift register is provided, comprising:

an inputting circuit, having a first terminal connected to a signal inputting terminal and a second terminal connected to a pulling up node, wherein the inputting circuit is configured to control a potential of the pulling up node, under the control of the signal inputting terminal;

a pulling down driving circuit, having a first terminal connected to a direct current (DC) signal terminal, a second terminal connected to a pulling down node, a third terminal connected to the pulling up node, and a fourth terminal connected to a low level signal terminal, wherein the pulling down driving circuit is configured to control the pulling down node being at a low level when the pulling up node is at a high level and to control the pulling up node being at the low level when the pulling down node is at the high level;

a resetting circuit, having a first terminal connected to a resetting signal terminal, a second terminal connected to the pulling up node, a third terminal connected to the low level signal terminal, and a fourth terminal connected to a signal outputting terminal, wherein the resetting circuit is configured to pull down the potentials of the pulling up node and the signal outputting terminal, under the control of the resetting signal terminal;

a first outputting circuit, having a first terminal connected to the pulling down node, a second terminal connected to the low level signal terminal, and a third terminal connected to the signal outputting terminal, wherein the first outputting circuit is configured to pull down the potential of the signal outputting terminal, under the control of the pulling down node;

a controlling circuit, having a first terminal connected to the DC signal terminal, a second terminal connected to a ground, a third terminal connected to the low level signal terminal, a fourth terminal connected to the pulling up node, and a fifth terminal connected to a first terminal of a second outputting circuit, wherein the controlling circuit is configured to connect the second outputting circuit with the pulling up node when the pulling up node is at the high level, and to pull the potential of the first terminal of the second outputting circuit down to a potential as twice as the potential of the low level signal terminal when the pulling up node is at the low level, under the control of the DC signal terminal and the pulling up node; and the second outputting circuit, having a second terminal connected to the pulling up node, a third terminal connected to a clock signal terminal and a fourth terminal connected to the signal outputting terminal, wherein the second outputting circuit is configured to output a signal of a clock signal terminal via the signal outputting terminal, under the control of the pulling up node.

According to another aspect of the embodiments of the present disclosure, a gate line driving circuit is provided, comprising a plurality of cascaded shift registers discussed above, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

According to another aspect of the embodiments of the present disclosure, an array substrate is provided, comprising the gate line driving circuit discussed above.

According to another aspect of the embodiments of the present disclosure, a display apparatus is provided, comprising the array substrate discussed above.

DETAILED DESCRIPTION

Specific implementations of a shift register, a gate line driving circuit, an array substrate and a display apparatus according to embodiments of the present disclosure will be described in detail below in conjunction with accompanying drawings.

Figure 1:
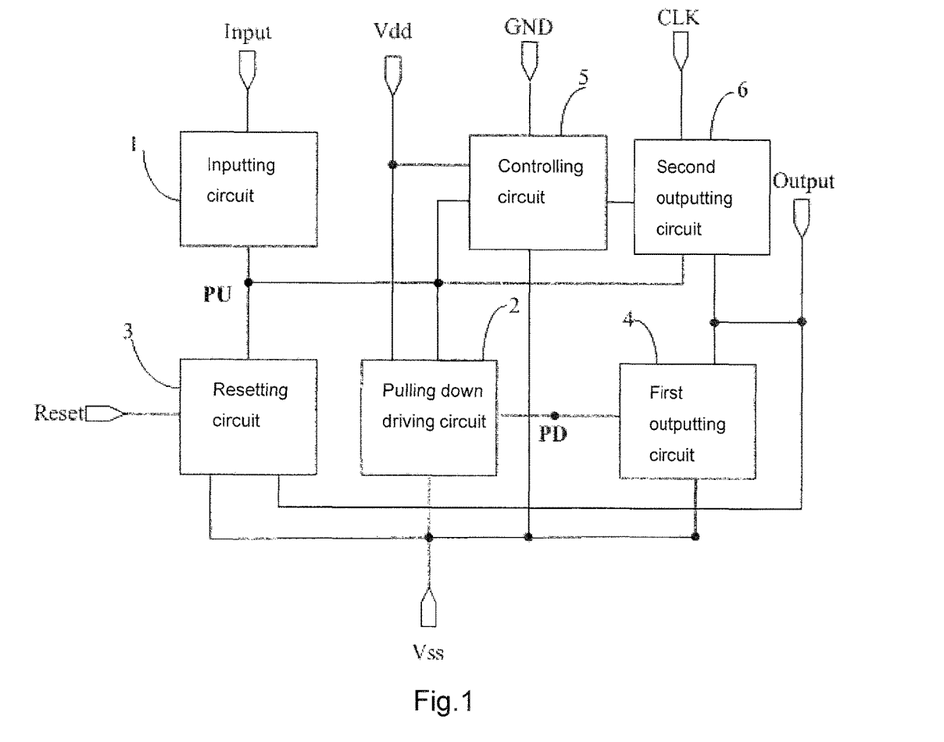
FIG. 1 shows a schematic diagram of a shift register according to embodiments of the present disclosure.

As shown in FIG. 1, the shift register according to the embodiments of the present disclosure may comprise an inputting circuit 1, a pulling down driving circuit 2, a resetting circuit 3, a first outputting circuit 4, a controlling circuit 5 and a second outputting circuit 6, wherein:

the inputting circuit 1 may have a first terminal connected to a signal inputting terminal (Input) and a second terminal connected to a pulling up node (PU), wherein the inputting circuit 1 is configured to control a potential of the pulling up node (PU), under the control of the signal inputting terminal (Input);

the pulling down driving circuit 2 may have a first terminal connected to a direct current (DC) signal terminal (Vdd), a second terminal connected to a pulling down node (PD), a third terminal connected to the pulling up node (PU), and a fourth terminal connected to a low level signal terminal (Vss), wherein the pulling down driving circuit 2 is configured to control the pulling down node (PD) being at a low level when the pulling up node (PU) is at a high level and to control the pulling up node (PU) being at the high level when the pulling down node (PD) is at the high level;

the resetting circuit 3 may have a first terminal connected to a resetting signal terminal (Reset), a second terminal connected to the pulling up node (PU), a third terminal connected to the low level signal terminal (Vss), and a fourth terminal connected to a signal outputting terminal (Output), wherein the resetting circuit 3 is configured to pull down the potentials of the pulling up node (PU) and the signal outputting terminal (Output), under the control of the resetting signal terminal (Reset);

the first outputting circuit 4 may have a first terminal connected to the pulling down node (PD), a second terminal connected to the low level signal terminal (Vss), and a third terminal connected to the signal outputting terminal (Output), wherein the first outputting circuit 4 is configured to pull down the potential of the signal outputting terminal (Output), under the control of the pulling down node (PD);

the controlling circuit 5 may have a first terminal connected to the DC signal terminal (Vdd), a second terminal connected to a ground (GND), a third terminal connected to the low level signal terminal (Vss), a fourth terminal connected to the pulling up node (PU), and a fifth terminal connected to a first terminal of the second outputting circuit 6, wherein the controlling circuit 5 is configured to connect the second outputting circuit 6 with the pulling up node (PU) when the pulling up node (PU) is at the high level, and to pull the potential of the first terminal of the second outputting circuit 6 down to a potential as twice as the potential of the low level signal terminal (Vss) when the pulling up node (PU) is at the low level, under the control of the DC signal terminal (Vdd) and the pulling up node (PU); and the second outputting circuit 6 may have a second terminal connected to the pulling up node (PU), a third terminal connected to a clock signal terminal (CLK) and a fourth terminal connected to the signal outputting terminal (Output), wherein the second outputting circuit 6 is configured to output a signal of a clock signal terminal (CLK) via the signal outputting terminal (Output), under the control of the pulling up node (PU).

According to the above shift register, due to an action of the controlling circuit on the second outputting circuit, a cut off negative voltage for the first terminal of the second outputting circuit can be a potential as twice as the potential of the low level signal terminal, without an external circuit for generating a reference voltage signal, which can improve a stability of an output of the shift register.

The present disclosure will be described in detail below in conjunction with specific embodiments. It should be noted that the embodiments are only provided for the purpose of better understanding the present disclosure instead of limiting the present disclosure.

Figure 2:
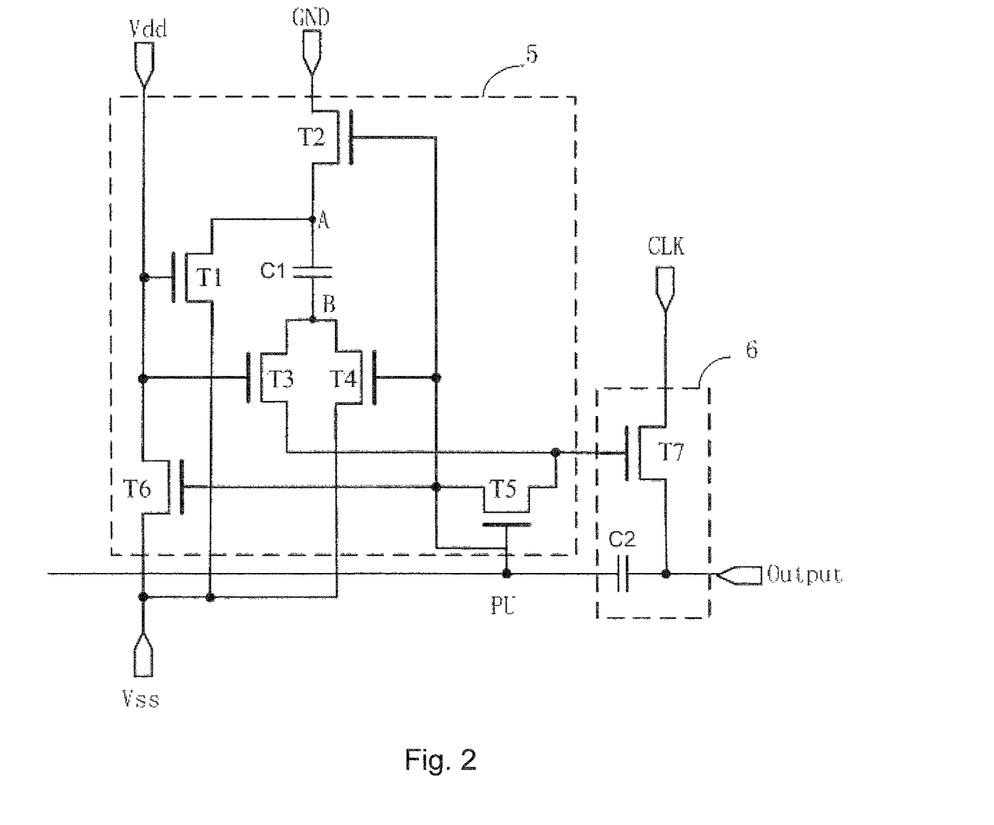
FIGS. 2 and 3 are schematic diagrams of a controlling circuit and a second outputting circuit in the shift register according to the embodiments of the present disclosure.
Figure 3:
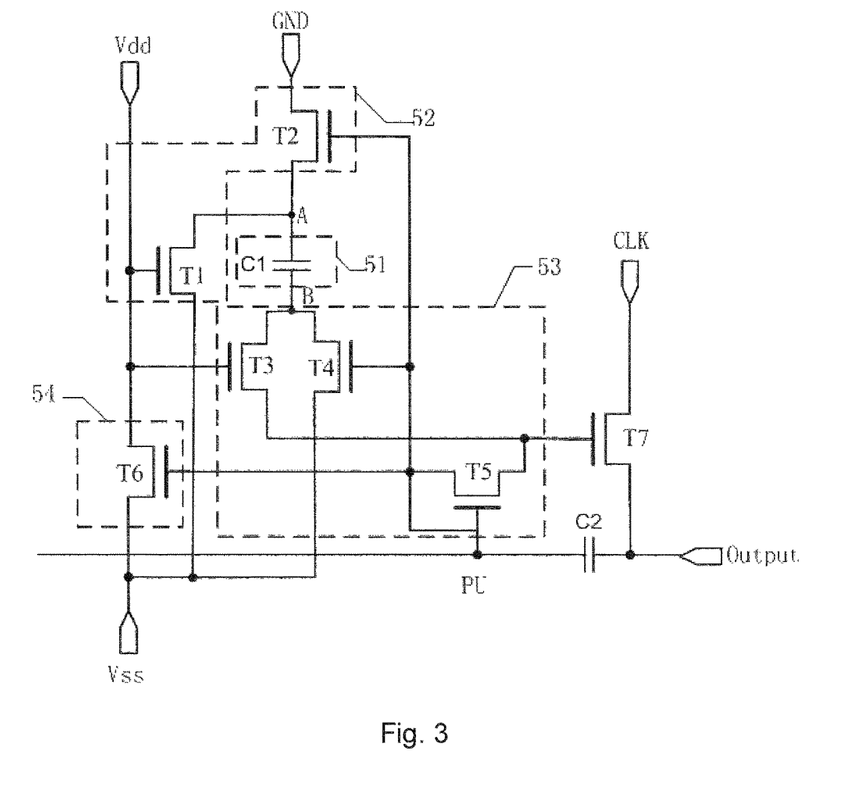

Preferably, in an implementation, as shown in FIGS. 2 and 3, the controlling circuit 5 may comprise a charging unit 51, a first controlling unit 52, a second controlling unit 53 and a pulling-down unit 54, wherein:

the charging unit 51 may have a first terminal connected to a first node (A) and a second terminal connected to a second node (B), and the charging unit is configured to change the potentials of the first node (A) and the second node (B);

the first controlling unit 52 may have a first terminal connected to the DC signal terminal (Vdd), a second terminal connected to the ground (GND), a third terminal connected to the first node (A), a fourth terminal connected to the pulling up node (PU), a fifth terminal connected to the low level signal terminal (Vss), and the first controlling unit is configured to control the potential of the first node (A), under the control of the pulling up node (PU) and the DC signal terminal (Vdd);

the second controlling unit 53 may have a first terminal connected to the DC signal terminal (Vdd), a second terminal connected to the pulling up node (PU), a third terminal connected to the second node (B) and a fourth terminal connected to the first terminal of the second outputting circuit 6, and the second controlling unit 53 is configured to control the potential of the second node (B), under the control of the pulling up node (PU) and the DC signal terminal (Vdd); and the pulling down unit 54 may have a first terminal connected to the DC signal terminal (Vdd), a second terminal connected to the pulling up node (PU) and a third terminal connected to the low level signal terminal (Vss), and the pulling down unit 54 is configured to pull down the potentials of the first terminal of the first controlling unit 52 and the first terminal of the second controlling unit 53, under the control of the pulling up node (PU).

In an implementation, the charging unit 51 may comprise a first capacitor (C1) connected between the first node (A) and the second node (B).

A specific structure of the charging unit in the shift register is merely described above by way of example, and in a specific implementation, the specific structure of the charging unit is not limited to the above structure according to the embodiment of the present disclosure, and may also be another structure well-known for those skilled in the art, which is not limited here.

In an implementation, as shown in FIG. 3, the first controlling unit 52 may comprise a first switch transistor T1 and a second switch transistor T2, wherein:

the first switch transistor T1 may have a gate connected to the DC signal terminal (Vdd), a source connected to the first node (A) and a drain connected to the low level signal terminal (Vss); and the second switch transistor T2 may have a gate connected to the pulling up node (PU), a source connected to the ground (GND) and a drain connected to the first node (A).

A specific structure of the first controlling unit in the shift register is merely described above by way of example, and in a specific implementation, the specific structure of the first controlling unit is not limited to the above structure according to the embodiment of the present disclosure, and may also be another structure well-known for those skilled in the art, which is not limited here.

In an implementation, as shown in FIG. 3, the second controlling unit 53 may comprise a third switch transistor T3, a fourth switch transistor T4 and a fifth switch transistor T5, wherein:

the third switch transistor T3 may have a gate connected to the DC signal terminal (Vdd), a source connected to the second node (B) and a drain connected to the first terminal of the second outputting circuit 6;

the fourth switch transistor T4 may have a gate connected to the pulling up node (PU), a source connected to the second node (B) and a drain connected to the low level signal terminal (Vss); and the fifth switch transistor T5 may have a gate and a source connected to the pulling up node (PU) respectively, and a drain connected to the first terminal of the second outputting circuit 6.

A specific structure of the second controlling unit in the shift register is merely described above by way of example, and in a specific implementation, the specific structure of the second controlling unit is not limited to the above structure according to the embodiment of the present disclosure, and may also be another structure well-known for those skilled in the art, which is not limited here.

In an implementation, as shown in FIG. 3, the pulling down unit 54 may comprise a sixth switch transistor T6, wherein:

the sixth switch transistor may have a gate connected to the pulling up node (PU), a source connected to the DC signal terminal (Vdd), and a drain connected to the low level signal terminal (Vss).

A specific structure of the pulling down unit in the shift register is merely described above by way of example, and in a specific implementation, the specific structure of the pulling down unit is not limited to the above structure according to the embodiment of the present disclosure, and may also be another structure well-known for those skilled in the art, which is not limited here.

In an implementation, as shown in FIG. 2, the pulling down unit 6 may comprise a seventh switch transistor T7 and a second capacitor C2, wherein:

the seventh switch transistor T7 may have a gate connected to the drain of the third switch transistor T3 and the drain of the fifth switch transistor T5, a source connected to the clock signal terminal (CLK), and a drain connected to the signal outputting terminal (Output); and the second capacitor C2 may be configured to be connected between the pulling up node (PU) and the signal outputting terminal (Output).

A specific structure of the second outputting circuit in the shift register is merely described above by way of example, and in a specific implementation, the specific structure of the second outputting circuit is not limited to the above structure according to the embodiment of the present disclosure, and may also be another structure well-known for those skilled in the art, which is not limited here.

Figure 4:
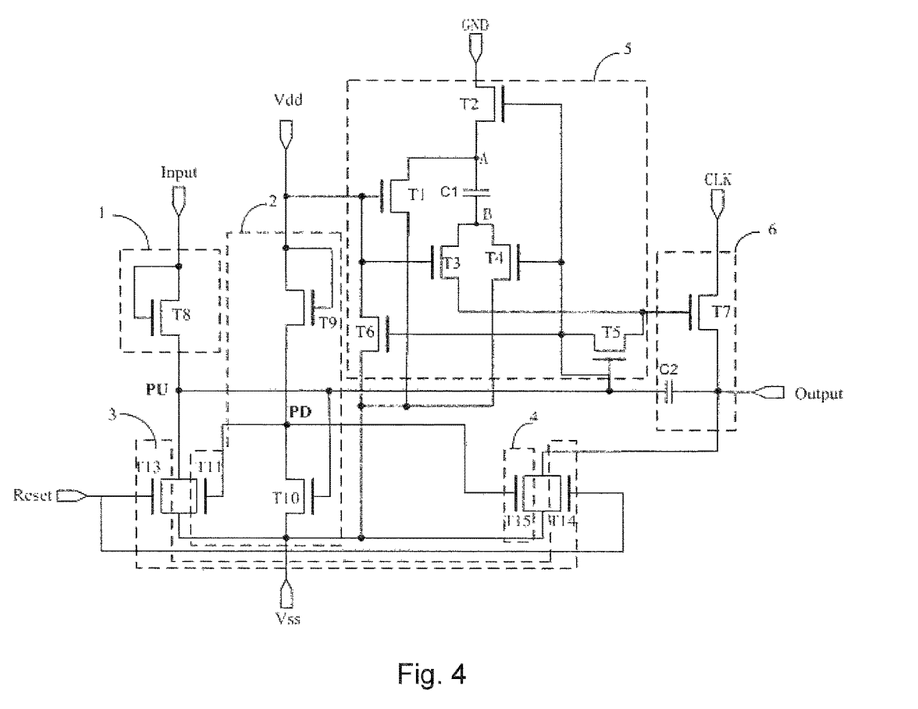
FIG. 4 shows another schematic diagram of the shift register according to the embodiments of the present disclosure.

In an implementation, as shown in FIG. 4, the inputting circuit 1 may comprise an eighth switch transistor T8, wherein:

the eighth switch transistor T8 may have a gate and a source connected to the signal inputting terminal (Input) respectively, and a drain connected to the pulling up node (PU).

A specific structure of the inputting circuit in the shift register is merely described above by way of example, and in a specific implementation, the specific structure of the inputting circuit is not limited to the above structure according to the embodiment of the present disclosure, and may also be another structure well-known for those skilled in the art, which is not limited here.

In an implementation, as shown in FIG. 4, the pulling down driving circuit 2 may comprise a ninth switch transistor T9, a tenth switch transistor T10 and an eleventh switch transistor T11, wherein:

the ninth switch transistor T9 may have a gate and a source connected to the DC signal terminal (Vdd) respectively, and a drain connected to the pulling down node (PD);

the tenth switch transistor T10 may have a gate connected to the pulling up node (PU), a source connected to the pulling down node (PD) and a drain connected to the low level signal terminal (Vss); and the eleventh switch transistor T11 may have a gate connected to the pulling down node (PD), a source connected to the pulling up terminal (PU) and a drain connected to the low level signal terminal (Vss).

Figure 5:
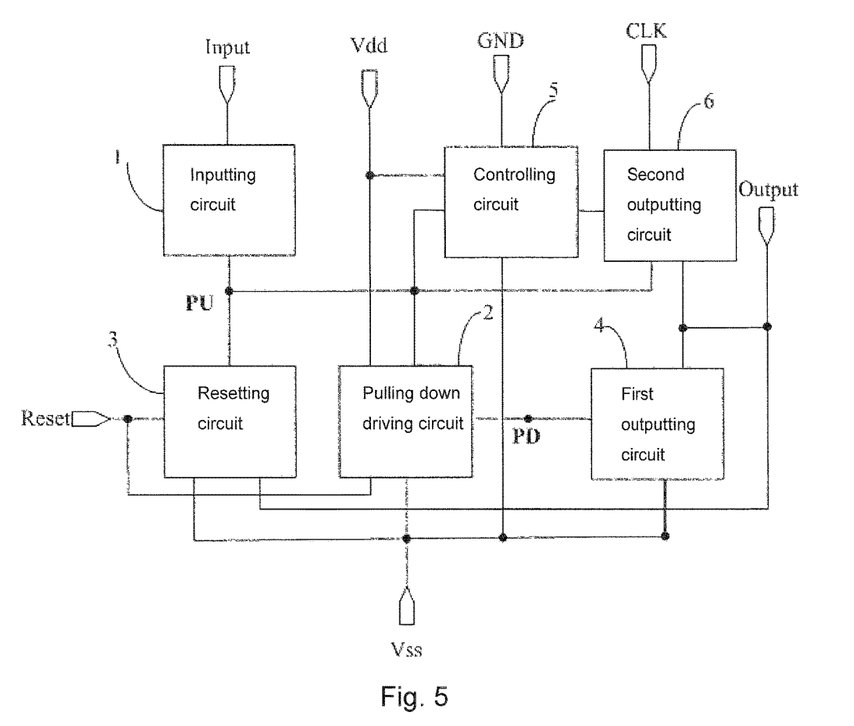
FIG. 5 shows still another schematic diagram of the shift register according to the embodiments of the present disclosure.

In an implementation, as shown in FIG. 5, the pulling down driving circuit 2 may comprise a fifth terminal connected to the resetting signal terminal (Reset).

Figure 6:
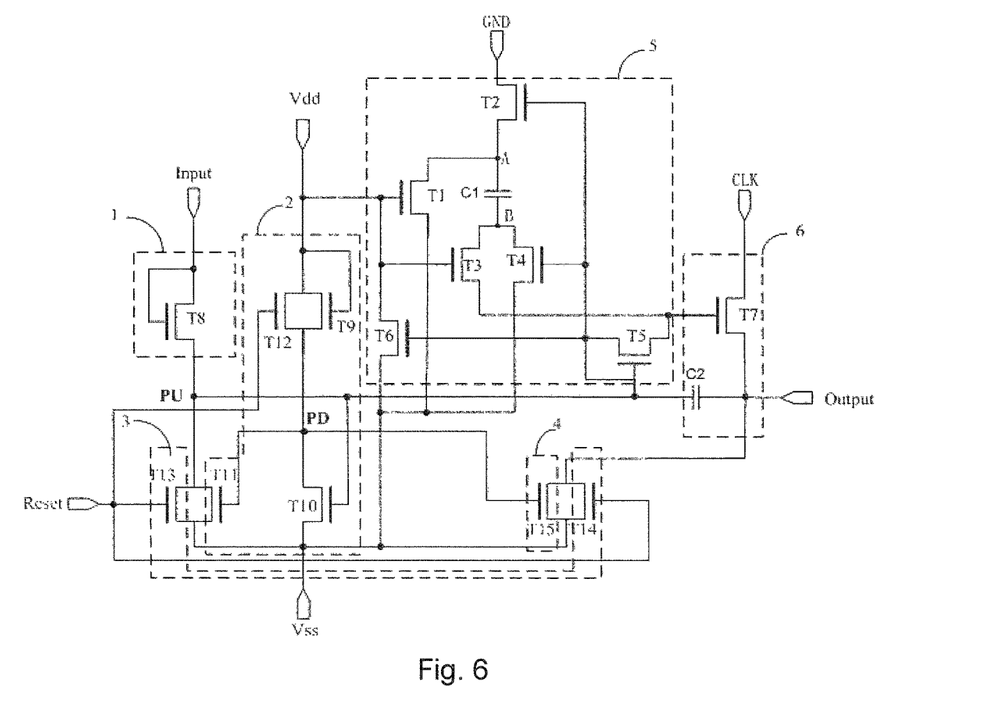
FIG. 6 shows yet another schematic diagram of the shift register according to the embodiments of the present disclosure.

In an implementation, as shown in FIG. 6, the pulling down driving circuit 2 may comprise a twelfth switch transistor T12, wherein:

the twelfth switch transistor T12 may have a gate connected to the resetting signal terminal, a source connected to the DC signal terminal and a drain connected to the pulling down node.

A specific structure of the pulling down driving circuit in the shift register is merely described above by way of example, and in a specific implementation, the specific structure of the pulling down driving circuit is not limited to the above structure according to the embodiment of the present disclosure, and may also be another structure well-known for those skilled in the art, which is not limited here.

In an implementation, as shown in FIGS. 4 and 6, the resetting circuit 3 may comprise a thirteenth switch transistor T13 and a thirteenth switch transistor T14, wherein:

the thirteenth switch transistor T13 may have a gate connected to the resetting signal terminal (Reset), a source connected to the low level signal terminal (Vss) and a drain connected to the pulling up node (PU); and the fourteenth switch transistor T14 may have a gate connected to the resetting signal terminal (Reset), a source connected to the low level signal terminal (Vss) and a drain connected to the signal outputting terminal (Output).

A specific structure of the resetting circuit in the shift register is merely described above by way of example, and in a specific implementation, the specific structure of the resetting circuit is not limited to the above structure according to the embodiment of the present disclosure, and may also be another structure well-known for those skilled in the art, which is not limited here.

In an implementation, as shown in FIGS. 4 and 6, the first outputting circuit 4 may comprise a fifteenth switch transistor T15, wherein:

the fifteenth switch transistor T15 may have a gate connected to the pulling down node (PD), a source connected to the low level signal terminal (Vss) and a drain connected to the signal outputting terminal (Output).

A specific structure of the first outputting circuit in the shift register is merely described above by way of example, and in a specific implementation, the specific structure of the first outputting circuit is not limited to the above structure according to the embodiment of the present disclosure, and may also be another structure well-known for those skilled in the art, which is not limited here.

It should be noted that the switch transistor mentioned above may be a thin film transistor (TFT) or a metal oxide semiconductor (MOS) field effect transistor, which is not limited here. In an implementation, the sources and drains of these switch transistors may interchange their functions depending on different inputting signals, which are not limited here.

Hereinafter, by taking a N-type transistor for an example, operations of the shift register according to the embodiments of the present disclosure is discussed in details. In the following description, 1 indicates for a high level and 0 indicates for a low level.

In particular, the operations of the shift register according to the embodiments of the present disclosure are discussed by taking the shift register shown in FIG. 6 for an example. In the shift register, each of switch transistors is a N-type transistor, which is turned on when its gate is at a high level and turned off when the gate is at a low level. An effective pulse signal at inputting signal terminal (Input) is a high level signal. A low level signal outputted from the low level signal terminal (Vss) is at −8V. Furthermore, GND is at 0V.

Figure 7:
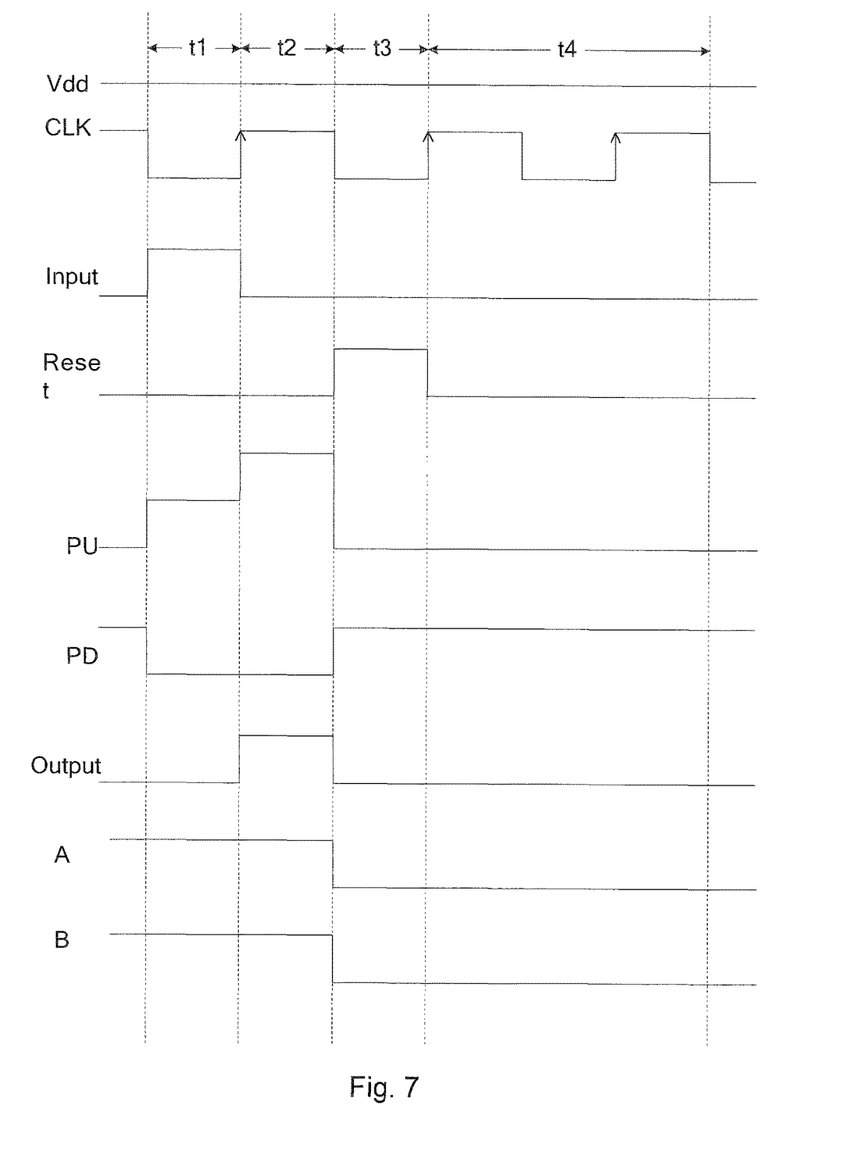
FIG. 7 is a timing diagram of an input/output of the shift register according to the embodiments of the present disclosure.

The DC signal terminal (Vdd) is a DC signal. A timing diagram of an input/output of the shift register is shown in FIG. 7. In particular, four phases (t1, t2, t3 and t4) are selected form the timing diagram shown in FIG. 7.

At a first phase t1, Input=1, Reset=0, CLK=0 and Vdd=1.

At the first phase t1, since the Reset is at the low level, the twelfth switch transistor T12, the thirteenth switch transistor T13 and the fourteenth switch transistor T14 are turned off. Furthermore, since the Input is at the high level, the eighth switch transistor T8 is turned on and controls to operate the shift register. The Input may pull up the pulling up node (PU) by the switch transistor T8. Since the pulling up node (PU) is pulled up, the tenth switch transistor T10 is turned on, and since the Vdd is at a high level, the ninth switch transistor T9 is turned on. Thus, the DC signal can pass through the ninth switch transistor T9 to the pulling down node (PD). Therefore, the pulling down node (PD) is pulled up to the high level. Since the pulling down node (PD) may be pulled up by the ninth switch transistor T9 and then pulled down by the tenth switch transistor T10, an inverter may be constituted of the ninth switch transistor T9 and the tenth switch transistor T10. At this time, the eleventh switch transistor T11 and the fifteenth switch transistor T15 are turned off. Since the pulling up node (PU) is at the high level, the second capacitor C2 is in a charging status, and the fifth switch transistor T5, the sixth switch transistor T6, the fourth switch transistor T4, the second switch transistor T2 and the seventh switch transistor T7 are turned on. The low level signal terminal (Vss) may deliver its potential of −8V to the second node (B) via the fourth switch transistor T4, and then the second node (B) is at −8V. At this time, since the source of the second switch transistor T2 is connected to the ground, i.e. the first node (A) is at 0V, the first capacitor C1 is also in the charging status. In summary, the capacitors C1 and C2 in the shift register are both in the charging status at the first phase T1. In addition, since the CLK is at a low level, the signal outputting terminal (Output) is also at the low level. At this time, the cut off voltage of the seventh switch transistor T7 is −8V.

At a second phase t2, Input=0, Reset=0, CLK=1 and Vdd=1.

At the second phase t2, since the Reset remains at the low level, the twelfth switch transistor T12, the thirteenth switch transistor T13 and the fourteenth switch transistor T14 are still turned off. However, since the Input turns into the low level, the eighth switch transistor T8 is turned off. In addition, since the Vdd remains at the high level, the ninth switch transistor T9 is still turned on, and the DC signal can pass through the ninth switch transistor T9 to the pulling down node (PD). Due to a bootstrap of the second capacitor C2, the pulling up node (PU) will be further pulled up. Thus, the fifth switch transistor T5, the sixth switch transistor T6, the fourth switch transistor T4, the second switch transistor T2 and the seventh switch transistor T7 are still turned on. Furthermore, the first capacitor C1 may remain in the charging status until it is saturated. The clock signal (CLK) may be delivered to the signal outputting terminal (Output) via the seventh switch transistor T7. Then, the potential of the signal outputting terminal (Output) may turn into the high level.

At a third phase t3, Input=0, Reset=1, CLK=0 and Vdd=1.

At the third phase t3, since the Reset turns into the high level, the twelfth switch transistor T12, the thirteenth switch transistor T13 and the fourteenth switch transistor T14 are turned on. However, since the Input remains at the low level, the eighth switch transistor T8 is still turned off, and since the Vdd remains at the high level, the ninth switch transistor T9 is still turned on. The low level signal can pass through the thirteenth switch transistor T13 to the pulling up node (PU), and then the pulling up node (PU) may turn into the low level. At this time, the second capacitor C2 is in a discharging status, then the fifth switch transistor T5, the sixth switch transistor T6, the fourth switch transistor T4, the second switch transistor T2 and the seventh switch transistor T7 are turned off, and the first switch transistor T1 and the third switch transistor T3 are turned on. Thus, the low level signal of −8V can pass through the first switch transistor T1 to the first node (A), and then the first node (A) is at −8V.

Since the first capacitor C1 is saturated, the potential of the second node (B) turns into −16V immediately. The potential of −16V may be delivered to the gate of the seventh switch transistor T7 via the third switch transistor T3. Then, the potential at the gate of the seventh switch transistor T7 is −16V. Since the twelfth switch transistor T12 is turned on, it will assisting the ninth switch transistor T9 in pulling up the potential at the pulling down node (PD) to the high level. Thus, the pulling down node (PD) may turn on the eleventh switch transistor T11 and the fifteenth switch transistor T15. The low level signal will pass through the eleventh switch transistor T11 to the pulling up node (PU), thereby enabling the pulling up node (PU) being at the low level. Then, the low level signal will pass through the fifteenth switch transistor T15 to the signal outputting terminal (Output), and will pass through the fourteenth switch transistor T14 to the signal outputting terminal (Output), thereby enabling the signal outputting terminal (Output) turning into the low level of −8V. At this time, the cut off voltage of the seventh switch transistor T7 is −16V. In this case, the voltage difference between the gate and the source is −8V, which enable the switch transistor being turned off perfectly, i.e. being equivalent to an open circuit. This may prevent a significant leakage current at a high temperature. Thus, signal outputted from the signal outputting terminal (Output) will not fluctuate with the high level clock signal terminal (CLK) during a period in which the signal is supposed to be turned off. Therefore, no abnormal display will be caused.

At a fourth phase t4, Input=0, Reset=0, CLK=1 or 0 and Vdd=1.

At the fourth phase t4, since the Reset turns into the low level, the twelfth switch transistor T12, the thirteenth switch transistor T13 and the fourteenth switch transistor T14 are turned off. However, since the Input remains at the low level, the eighth switch transistor T8 is still turned off, and since the Vdd remains at the high level, the ninth switch transistor T9 is still turned on and the pulling down node (PD) remains at the high level. The pulling down node (PD) may keep turning on the eleventh switch transistor T11 and the fifteenth switch transistor T15. The low level signal will pass through the thirteenth switch transistor T13 to the pulling up node (PU), thereby enabling the pulling up node (PU) being at the low level. At this time, the second capacitor C2 is in the discharging unit, then the fifth switch transistor T5, the sixth switch transistor T6, the fourth switch transistor T4, the second switch transistor T2 and the seventh switch transistor T7 are still turned off, and the first switch transistor T1 and the third switch transistor T3 are still turned on. Since the seventh switch transistor T7 is turned off and the voltage difference between the gate and the source is −8V, the seventh switch transistor T7 is in a perfect turned off status. In summary, the potential of the clock signal terminal (CLK) has no effect on the signal outputting terminal (Output). The low level signal can pass through the fifteenth switch transistor T15 to the signal outputting terminal (Output), so as to keep the signal outputting terminal (Output) at the low level.

Then, the shift register will repeat the four phases discussed above until it begins to receive a next frame of the inputting signal.

Figure 8:
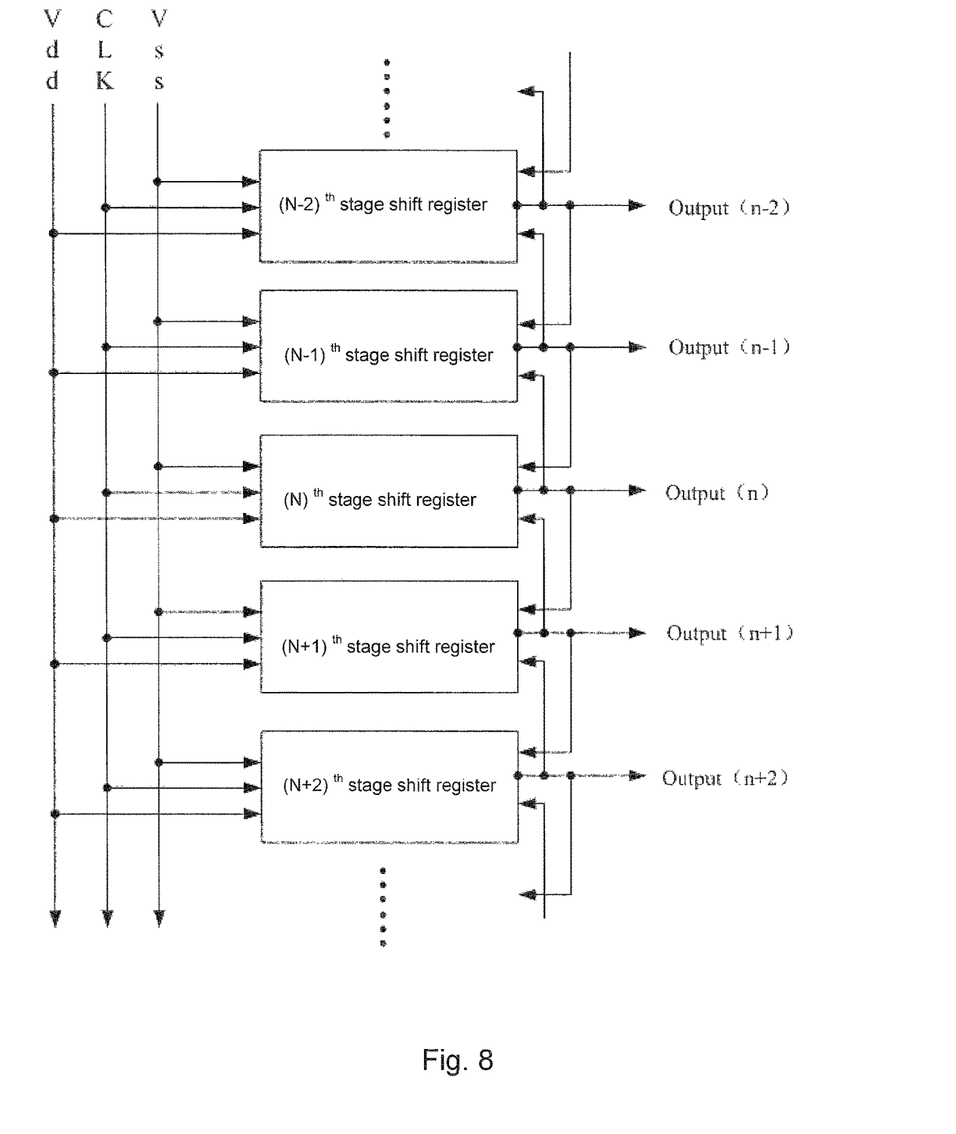
FIG. 8 is a schematic diagram of a gate line driving circuit according to the embodiments of the present disclosure.

Based on the same inventive concept, the embodiments of the present disclosure further provide a gate line driving circuit. As shown in FIG. 8, the gate line driving circuit may comprise a plurality of cascaded shift registers discussed above. Each of the rest of the shift registers other than a first shift register and a last shift register may be configured to input a trigger signal to the signal inputting terminal of its next shift register which is adjacent to it, and to input a resetting signal to the resetting signal terminal of its previous shift register which is adjacent to it. Furthermore, the first shift register may be configured to input the trigger signal to the signal inputting terminal of a second shift register, and the last shift register may be configured to input a resetting signal to the resetting signal terminal of its previous shift register.

For a better understanding, FIG. 8 only shows five shift registers, which are a $(N-2)^{th}$ stage shift register, a $(N-1)^{th}$ stage shift register, a $N^{th}$ stage shift register, a $(N+1)^{th}$ stage shift register and a $(N+2)^{th}$ stage shift register, respectively. In particular, the signal outputting terminal of the $N^{th}$ shift register (Output(n)) is not only configured to input a feedback signal to the $(N-1)^{th}$ stage shift register, but also to input a trigger signal to the $(N+1)^{th}$ stage shift register.

A specific structure and function of each shift register in the gate line driving circuit discussed above are the same as those in the shift register according to the above embodiments of the present disclosure. Thus, the detailed description will no longer be repeated.

Based on the same inventive concept, the embodiments of the present disclosure further provide an array substrate comprising the above gate line driving circuit. A specific implementation thereof can be known with reference to the description of the gate line driving circuit described above, and the same content will no longer be repeated.

Based on the same inventive concept, the embodiments of the present disclosure further provide a display apparatus comprising the above array substrate. A specific implementation thereof can be known with reference to the description of the array substrate described above, and the same content will no longer be repeated. The display apparatus may be implemented with any product or part which can have a display function, such as a mobile phone, a tablet, a television, a displayer, a laptop, a digital frame, a navigator and the like. Those skilled in the art should understand that the display apparatus may also comprise parts which are necessary for the display apparatus but are not described herein, and those parts should not be considered as a limitation to the present disclosure. A specific implementation of the display apparatus may be also known with reference to the description of the shift register described above, and the same content will no longer be repeated.

The embodiments of the present disclosure provide a shift register, a gate line driving circuit, an array substrate and a display apparatus, which may comprise an inputting circuit, a pulling down driving circuit, a resetting circuit, a first outputting circuit, a controlling circuit and a second outputting circuit. The inputting circuit may have a first terminal connected to a signal inputting terminal and a second terminal connected to a pulling up node, and the inputting circuit is configured to control a potential of the pulling up node, under the control of the signal inputting terminal. The pulling down driving circuit may have a first terminal connected to a direct current (DC) signal terminal, a second terminal connected to a pulling down node, a third terminal connected to the pulling up node, a fourth terminal connected to a low level signal terminal and a fifth terminal connected to the resetting signal terminal, and the pulling down driving circuit may be configured to control the pulling down node being at a low level when the pulling up node is at a high level and to control the pulling up node being at the low level when the pulling down node is at the high level. The resetting circuit may have a first terminal connected to a resetting signal terminal, a second terminal connected to the pulling up node, a third terminal connected to the low level signal terminal, and a fourth terminal connected to a signal outputting terminal, and the resetting circuit may be configured to pull down the potentials of the pulling up node and the signal outputting terminal, under the control of the resetting signal terminal. The first outputting circuit may have a first terminal connected to the pulling down node, a second terminal connected to the low level signal terminal, and a third terminal connected to the signal outputting terminal, and the first outputting circuit may be configured to pull down the potential of the signal outputting terminal, under the control of the pulling down node. The controlling circuit may have a first terminal connected to the DC signal terminal, a second terminal connected to a ground, a third terminal connected to the low level signal terminal, a fourth terminal connected to the pulling up node, and a fifth terminal connected to a first terminal of the second outputting circuit, and the controlling circuit may be configured to connect the second outputting circuit with the pulling up node when the pulling up node is at the high level, and to pull the potential of the first terminal of the second outputting circuit down to a potential as twice as the potential of the low level signal terminal when the pulling up node is at the low level, under the control of the DC signal terminal and the pulling up node. The second outputting circuit may have a second terminal connected to the pulling up node, a third terminal connected to a clock signal terminal and a fourth terminal connected to the signal outputting terminal, and the second outputting circuit may be configured to output a signal of a clock signal terminal via the signal outputting terminal, under the control of the pulling up node. Therefore, due to an action of the controlling circuit on the second outputting circuit in the shift register according to the embodiments of the present disclosure, a cut off negative voltage for the first terminal of the second outputting circuit can be a potential as twice as the potential of the low level signal terminal, without an external circuit for generating a reference voltage signal, which can improve a stability of the output of the shift register.

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

We claim:

1. A shift register, comprising:
an inputting circuit, having a first terminal connected to a signal inputting terminal and a second terminal connected to a pulling up node, wherein the inputting circuit is configured to control a potential of the pulling up node, under the control of the signal inputting terminal;
a pulling down driving circuit, having a first terminal connected to a direct current (DC) signal terminal, a second terminal connected to a pulling down node, a third terminal connected to the pulling up node, and a fourth terminal connected to a low level signal terminal, wherein the pulling down driving circuit is configured to control the pulling down node being at a low level when the pulling up node is at a high level and to control the pulling up node being at the low level when the pulling down node is at the high level;
a resetting circuit, having a first terminal connected to a resetting signal terminal, a second terminal connected to the pulling up node, a third terminal connected to the low level signal terminal, and a fourth terminal connected to a signal outputting terminal, wherein the resetting circuit is configured to pull down the potentials of the pulling up node and the signal outputting terminal, under the control of the resetting signal terminal;
a first outputting circuit, having a first terminal connected to the pulling down node, a second terminal connected to the low level signal terminal, and a third terminal connected to the signal outputting terminal, wherein the first outputting circuit is configured to pull down the potential of the signal outputting terminal, under the control of the pulling down node;
a controlling circuit, having a first terminal connected to the DC signal terminal, a second terminal connected to a ground, a third terminal connected to the low level signal terminal, a fourth terminal connected to the pulling up node, and a fifth terminal connected to a first terminal of a second outputting circuit, wherein the controlling circuit is configured to connect the second outputting circuit with the pulling up node when the pulling up node is at the high level, and to pull the potential of the first terminal of the second outputting circuit down to a potential as twice as the potential of the low level signal terminal when the pulling up node is at the low level, under the control of the DC signal terminal and the pulling up node; and
the second outputting circuit, having a second terminal connected to the pulling up node, a third terminal connected to a clock signal terminal and a fourth terminal connected to the signal outputting terminal, wherein the second outputting circuit is configured to output a signal of a clock signal terminal via the signal outputting terminal, under the control of the pulling up node.

2. The shift register of claim 1, wherein the controlling circuit comprises a charging unit, a first controlling unit, a second controlling unit and a pulling-down unit,
wherein the charging unit has a first terminal connected to a first node and a second terminal connected to a second node, and the charging unit is configured to change the potentials of the first node and the second node;
the first controlling unit has a first terminal connected to the DC signal terminal, a second terminal connected to the ground, a third terminal connected to the first node, a fourth terminal connected to the pulling up node, a fifth terminal connected to the low level signal terminal, and the first controlling unit is configured to control the potential of the first node, under the control of the pulling up node and the DC signal terminal;
the second controlling unit has a first terminal connected to the DC signal terminal, a second terminal connected to the pulling up node, a third terminal connected to the second node and a fourth terminal connected to the first terminal of the second outputting circuit, and the second controlling unit is configured to control the potential of the second node, under the control of the pulling up node and the DC signal terminal; and
the pulling down unit has a first terminal connected to the DC signal terminal, a second terminal connected to the pulling up node and a third terminal connected to the low level signal terminal, and the pulling down unit is configured to pull down the potentials of the first terminal of the first controlling unit and the first terminal of the second controlling unit, under the control of the pulling up node.

3. The shift register of claim 2, wherein the charging unit comprises:
a first capacitor connected between the first node and the second node.

4. The shift register of claim 2, wherein the first controlling unit comprises:
a first switch transistor, having a gate connected to the DC signal terminal, a source connected to the first node and a drain connected to the low level signal terminal; and
a second switch transistor, having a gate connected to the pulling up node, a source connected to the ground and a drain connected to the first node;
the second controlling unit comprises a third switch transistor, a fourth switch transistor and a fifth switch transistor, wherein:
the third switch transistor has a gate connected to the DC signal terminal, a source connected to the second node and a drain connected to the first terminal of the second outputting circuit;
the fourth switch transistor has a gate connected to the pulling up node, a source connected to the second node and a drain connected to the low level signal terminal; and
the fifth switch transistor has a gate and a source connected to the pulling up node respectively, and a drain connected to the first terminal of the second outputting circuit.

5. The shift register of claim 4, wherein the second outputting circuit comprises:
a seventh switch transistor, having a gate connected to the drain of the third switch transistor and the drain of the fifth switch transistor, a source connected to the clock signal terminal, and a drain connected to the signal outputting terminal; and
a second capacitor configured to be connected between the pulling up node and the signal outputting terminal.

6. A gate line driving circuit, wherein the gate line driving circuit comprises a plurality of cascaded shift registers of claim 5, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

7. A gate line driving circuit, wherein the gate line driving circuit comprises a plurality of cascaded shift registers of claim 4, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

8. The shift register of claim 2, wherein the pulling down unit comprises:
a sixth switch transistor, having a gate connected to the pulling up node, a source connected to the DC signal terminal, and a drain connected to the low level signal terminal.

9. A gate line driving circuit, wherein the gate line driving circuit comprises a plurality of cascaded shift registers of claim 8, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

10. A gate line driving circuit, wherein the gate line driving circuit comprises a plurality of cascaded shift registers of claim 2, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

11. The shift register of claim 1, wherein the inputting circuit comprises:
an eighth switch transistor, having a gate and a source connected to the signal inputting terminal respectively, and a drain connected to the pulling up node.

12. A gate line driving circuit, wherein the gate line driving circuit comprises a plurality of cascaded shift registers of claim 11, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

13. The shift register of claim 1, wherein the pulling down driving circuit comprises:
a ninth switch transistor, having a gate and a source connected to the DC signal terminal respectively, and a drain connected to the pulling down node;
a tenth switch transistor, having a gate connected to the pulling up node, a source connected to the pulling down node and a drain connected to the low level signal terminal;
an eleventh switch transistor, having a gate connected to the pulling down node, a source connected to the pulling up terminal and a drain connected to the low level signal terminal;
a fifth terminal connected to the resetting signal terminal; and
a twelfth switch transistor, having a gate connected to the resetting signal terminal, a source connected to the DC signal terminal and a drain connected to the pulling down node.

14. A gate line driving circuit, wherein the gate line driving circuit comprises a plurality of cascaded shift registers of claim 13, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

15. The shift register of claim 1, wherein the resetting circuit comprises:
   a thirteenth switch transistor, having a gate connected to the resetting signal terminal, a source connected to the low level signal terminal and a drain connected to the pulling up node; and
   a fourteenth switch transistor, having a gate connected to the resetting signal terminal, a source connected to the low level signal terminal and a drain connected to the signal outputting terminal.

16. A gate line driving circuit, wherein the gate line riving circuit comprises a plurality of cascaded shift registers of claim 15, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

17. The shift register of claim 1, wherein the first outputting circuit comprises:
   a fifteenth switch transistor, having a gate connected to the pulling down node, a source connected to the low level signal terminal and a drain connected to the signal outputting terminal.

18. A gate line driving circuit, wherein the gate line driving circuit comprises a plurality of cascaded shift registers of claim 1, each of the rest of the shift registers other than a first shift register and a last shift register is configured to input a trigger signal to the signal inputting terminal of its next shift register which is adjacent to it, and to input a resetting signal to the resetting signal terminal of its previous shift register which is adjacent to it; and the first shift register is configured to input the trigger signal to the signal inputting terminal of a second shift register, and the last shift register is configured to input a resetting signal to the resetting signal terminal of its previous shift register.

19. An array substrate, wherein the array substrate comprises the gate line driving circuit of claim 18.

20. A display apparatus, comprising the array substrate of claim 19.

* * * * *